(12) United States Patent
Schadeck et al.

(10) Patent No.: US 10,333,229 B2
(45) Date of Patent: Jun. 25, 2019

(54) MODULAR HOUSING ARRANGEMENT FOR ANTENNAE

(71) Applicant: KATHREIN-WERKE KG, Rosenheim (DE)

(72) Inventors: Alexander Schadeck, Bernau am Chiemsee (DE); Josef Fahrenschon, Rosenheim (DE)

(73) Assignee: Kathrein SE, Rosenheim (DE)

( * ) Notice: Subject to any disclaimer, the term of this patent is extended or adjusted under 35 U.S.C. 154(b) by 316 days.

(21) Appl. No.: 15/448,945

(22) Filed: Mar. 3, 2017

(65) Prior Publication Data

US 2017/0256866 A1 Sep. 7, 2017

(30) Foreign Application Priority Data

Mar. 4, 2016 (DE) .................. 10 2016 104 000

(51) Int. Cl.
| | | |
|---|---|---|
| *H01Q 1/12* | (2006.01) | |
| *H01Q 21/00* | (2006.01) | |
| *H01Q 1/24* | (2006.01) | |
| *H01Q 1/42* | (2006.01) | |
| *H05K 5/00* | (2006.01) | |
| *H01Q 1/50* | (2006.01) | |

(52) U.S. Cl.
CPC .......... *H01Q 21/0025* (2013.01); *H01Q 1/12* (2013.01); *H01Q 1/1207* (2013.01); *H01Q 1/243* (2013.01); *H01Q 1/42* (2013.01); *H01Q 1/50* (2013.01); *H05K 5/0021* (2013.01)

(58) Field of Classification Search
CPC ............ H01Q 21/00; H01Q 1/12; H01Q 1/24; H01Q 1/42; H01Q 1/50
USPC ....................................... 343/702
See application file for complete search history.

(56) References Cited

U.S. PATENT DOCUMENTS

2013/0225222 A1* 8/2013 Ma ...................... H04W 84/042
                                                                  455/517
2014/0225484 A1* 8/2014 De Roeck .......... A47B 87/0292
                                                                  312/111

FOREIGN PATENT DOCUMENTS

| DE | 30 04 271 A1 | 8/1981 |
| DE | 38 36 497 | 5/1989 |
| DE | 298 00 502 U1 | 5/1999 |

OTHER PUBLICATIONS

Extended European Search Report dated Jul. 26, 2017, issued in European Patent Application No. 17156830.6.

* cited by examiner

*Primary Examiner* — Andrea Lindgren Baltzell
(74) *Attorney, Agent, or Firm* — Nixon & Vanderhye P.C.

(57) ABSTRACT

A modular housing arrangement for antennae comprises at least one antenna housing. The at least one antenna housing comprises a front face on the cover side, a front face on the base side and a peripheral side wall between the front face on the cover side and the front face on the base side that comprises a plurality of lateral surfaces, as a result which a receiving space is defined. At least one antenna is or can be arranged in the receiving space. At least one male and one female part of a positive and/or non-positive connection are arranged on the peripheral side wall. The at least one male part and the at least one female part are designed to establish a detachable positive and/or non-positive connection to a corresponding female or male part, respectively, of at least one further antenna housing and/or at least one connection element.

27 Claims, 13 Drawing Sheets

MODULAR HOUSING ARRANGEMENT FOR ANTENNAE

CROSS-REFERENCE TO RELATED APPLICATIONS

This application claims priority from DE 10 2016 104 000.2 filed Mar. 4, 2016, incorporated herein by reference.

FIELD

The technology herein relates to a modular housing arrangement for antennae, which can be used, in particular, for bidirectional mobile communication. Using such an antenna, certain regions are illuminated, i.e. supplied with voice and/or data services. For this purpose, the antennae, protected by radomes, are preferably mounted on masts that are as tall as possible in order to supply as large a region as possible. Antennae of various mobile communications providers, which are operated in different frequency ranges, are mounted on a single mast.

BACKGROUND AND SUMMARY

The supply of inner cities, where the signal is reflected many times on façades and where a very large number of participants is to be expected, is, however, problematic. The regions to be supplied by one antenna should sometimes be kept smaller here. At the same time, large antennae in inner cities disrupt the urban landscape more than in surrounding areas.

The example non-limiting technology herein provides a modular housing arrangement for antennae which can be used in particular in urban regions, this being intended to resolve the above problems and to be as simple as possible to install. Furthermore, it is intended for it to be possible to extend the antenna system for different providers as desired and as simply as possible.

This is achieved by the modular housing arrangement for antennae as described herein.

The modular housing arrangement for antennae provides at least one antenna housing (also referred to as a radome) which comprises a front face on the cover side, a front face on the base side and a peripheral side wall between the front face on the cover side and the front face on the base side that comprises a plurality of lateral surfaces, as a result of which a receiving space is defined. At least one antenna is arranged or can be arranged in the receiving space. On the peripheral side wall or on at least one, preferably on all, of the lateral surfaces of the peripheral side wall, at least one male and one female part of a positive and/or non-positive connection, in particular in the form of a snap connection, are arranged so as to be offset from one another. The at least one male part and at least one female part are designed to establish a positive and/or non-positive connection, which is detachable in a non-destructive and tool-free manner, to a corresponding female or male part, respectively, of at least one further antenna housing and/or of at least one connection element. In this case, it is particularly advantageous for it to be possible to interconnect a plurality of antenna housings as required by a positive and/or non-positive connection, in particular in the form of a snap connection or click connection. As a result of this, it is possible for the necessary antenna housings to be assembled very simply at the beginning of the installation of the modular housing arrangement. Even after installation has already been completed, the modular housing arrangement, as the name modular already implies, can very simply be extended by a new antenna housing being clipped onto it. Tools are not necessary for this and therefore the installation is greatly simplified. In this case, the modular housing arrangement can be mounted in and/or to or on "street furniture" such as bus shelters, public toilets, advertising hoardings, information boards, kiosks, ticket machines and advertising columns, etc. In this case, the individual antenna housings can be rented out to various mobile communications providers. The conventional communications standards such as GSM, UMTS and LTE can be offered via the individual antenna housings. A WLAN connection can also be provided, which is made available, for example, by the city or an advertising company. It is also possible for some antennae to act as repeaters, as a result of which a wired supply of the antennae of the modular housing arrangement can be omitted. The modular housing arrangement can therefore very easily be extended or dismantled as required.

In this case, the at least one male part is pin-shaped or approximately pin-shaped, whereas the at least one female part consists of a receiving element in the shape of a U and/or a bracket, or of at least two receiving elements in the shape of a U and/or a bracket that are spaced apart from one another in the axial direction, each receiving element in the shape of a U and/or a bracket consisting of two resilient retaining legs, by means of which the at least one male part is or can be retained in a positive manner.

Preferably, the male parts are designed identically to one another at least with respect to the arrangement or dimensions of their contact points, i.e. the points that engage in the female part. In this case, a fitter does not first have to check how he can connect one antenna housing to the other antenna housing or to a connecting element.

In this case, the at least one antenna housing is preferably formed integrally with all of the male and female parts which are arranged thereon. The at least one antenna housing preferably consists of plastics material and is produced in an injection moulding process. The front face on the cover side is preferably closed. Such a closure can be produced directly during production of the antenna housing such that the antenna housing is formed integrally together with the closed front face on the cover side. Such a closure can, however, also be provided in the form of a cover which is placed on later, i.e. after production. The front face on the base side is preferably fully or partially open such that the connection cable or the plug-in connection for the connection cable for the antennae arranged inside the antenna housing can be guided out.

In a development of the modular housing arrangement, the at least one antenna housing is in the shape of an n-gon where n≥4, at least one male part and at least one female part of the positive and/or non-positive connection being arranged on most or all of the n lateral surfaces of the peripheral side wall so as to be offset from one another in the peripheral direction. In this case, the male and the female part are arranged identically on each lateral surface so that the antenna housing can be rotated as desired.

When in use, the modular housing arrangement preferably comprises at least two antenna housings which can be or are directly or indirectly interconnected by means of the respective male and female parts of the positive and/or non-positive connection, the planes of the front faces on the cover side of the individual antenna housings being arranged at an angle of 0°, 90° and/or 180° to one another. This means that the individual antenna housings extend through the same plane or are arranged so as to be offset from one another by 90° such that different streets are illuminated or that the individual antenna housings are arranged so as to be offset from one another by 180° such that a front and a rear part of a street is illuminated. Other angular positions such as 120°, for example, are likewise conceivable.

In the event that both antenna housings are directly interconnected, at least one male part of each of the two antenna housings engages in a corresponding female part on the other antenna housing. In this case, the spacing between the individual antenna housings is minimal. In this case, the spacing should be selected such that MIMO operation (Multiple Input Multiple Output) of the at least two antenna housings having the respective antennae is possible.

The individual antenna housings can, however, also be interconnected only indirectly. In this case, both antenna housings are preferably connected to the same connecting element, which in this case is a spacer. The spacer has two opposing lateral surfaces, at least one male part and at least one female part of a positive and/or non-positive connection being arranged on each lateral surface so as to be offset from one another. The two lateral surfaces of the spacer are spaced apart from one another by an intermediate part, the spacer preferably being formed integrally with the intermediate part. Such a spacer is used if the antenna housings interconnected thereby are operated by different mobile communications providers or if no MIMO operation is intended for example. With respect to its dimensions, the size of the spacer is such that the individual antennae inside the at least two antenna housings influence each other as little as possible. The spacing between the individual antenna housings, which is precisely defined by the spacer, is also favourable for decoupling.

In order to further reinforce the modular housing arrangement, a further embodiment provides for the use of at least one connection element in the form of a reinforcing element. On a first lateral surface, the reinforcing element has at least one male part and at least one female part of a positive and/or non-positive connection, which are arranged so as to be offset from one another. In this case, the reinforcing element can be connected to just one lateral surface of the antenna housing, i.e. with precisely one antenna housing. It can, however, also be connected to two adjacent antenna housings, the male part of the reinforcing element engaging in the female part of a first antenna housing and the female part of the reinforcing element engaging in the male part of the other antenna housing.

On a first front face, the reinforcing element can additionally have a male part and on a second front face it can additionally have a female part of a positive and/or non-positive connection. As a result, it is possible for two reinforcing elements to be directly or indirectly interconnected. A direct connection can, for example, be achieved if the two antenna housings are directly interconnected without the use of a spacer. In this case, each reinforcing element can engage on just one lateral surface of the side wall of each antenna housing, the two reinforcing elements being additionally interconnected on their front face. In the event that the two antenna housings are interconnected only indirectly, i.e. are spaced apart from one another by a spacer, the male and female part on the respective front faces of both reinforcing elements can engage in the corresponding male and female part, respectively, on the front face of an intermediate connector, as a result of which the two reinforcing elements are indirectly interconnected.

It is also possible for the connecting element to be an L-bar connector which has a male part of a positive and/or non-positive connection on its first front face and a female part of a positive and/or non-positive connection on its second front face. The first front face of the at least one L-bar connector is connected to a reinforcing element, whereas the second front face of the L-bar connector engages in a male or female part of a further lateral surface of the peripheral side wall of the antenna housing. The further lateral surface is directly adjacent to the lateral surface of the peripheral side wall on which the reinforcing element engages. Using an L-bar connector, two directly adjacent lateral surfaces of the peripheral side wall of the antenna housing can be interconnected by the reinforcing element.

In addition, it is particularly advantageous if the reinforcing element comprises, on the lateral surface, at least two mutually offset male parts and/or at least two mutually offset female parts of a positive and/or non-positive connection. Depending on whether the two antenna housings are indirectly or directly interconnected, one or other of the at least two male or female parts engages with the relevant mating part. As a result, a reinforcing element can be used which interconnects two antenna housings on their peripheral side wall, in particular irrespective of whether the two antennae are each indirectly or directly interconnected.

In addition, it is also possible for the front faces on the cover side, i.e. the faces on which the antennae arranged inside the antenna housings radiate, not to point in the same direction. It is therefore also possible for the front faces on the base sides of two antenna housings to be arranged so as to be spaced apart from one another and oriented towards one another. In this case, the individual antenna housings are arranged so as to be offset from one another by 180°.

In this case, a connecting element in the form of a connecting plate can be used which is arranged perpendicularly to the two front faces on the cover side. The connecting plate has at least two male and at least two female parts of a positive and/or non-positive connection, said parts engaging in the corresponding mating parts on the first and on the second antenna housing.

The at least one antenna housing can also be attached to corresponding parts of a base structure and/or carrier plate by means of the at least one male and female part of the positive and/or non-positive connection, which structure or plate is part of a building structure and acts for attaching to the "street furniture". In the event that the "street furniture" itself has a male and a female part of such a positive and/or non-positive connection directly on its surface, the at least one antenna housing can, for example, be directly connected to the roof of a bus shelter.

In order to preserve the urban landscape, it is advantageous in this case for the modular housing arrangement to have an outer housing as well. In this case, the outer housing surrounds all of the antenna housings collectively and can, for example, be kept the same colour as the surrounding object structure.

BRIEF DESCRIPTION OF THE DRAWINGS

Various non-limiting embodiments are described below by way of example with reference to the drawings, in which the same items have the same reference numerals and in which, in detail.

Figure 6:
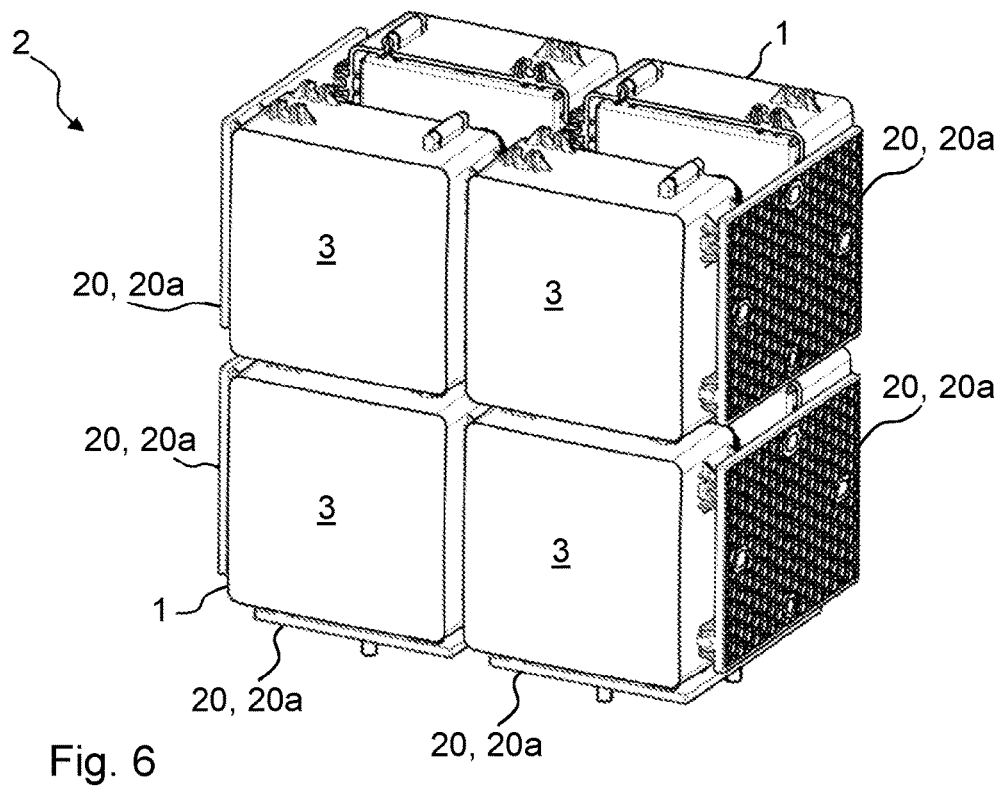
Figure 7:
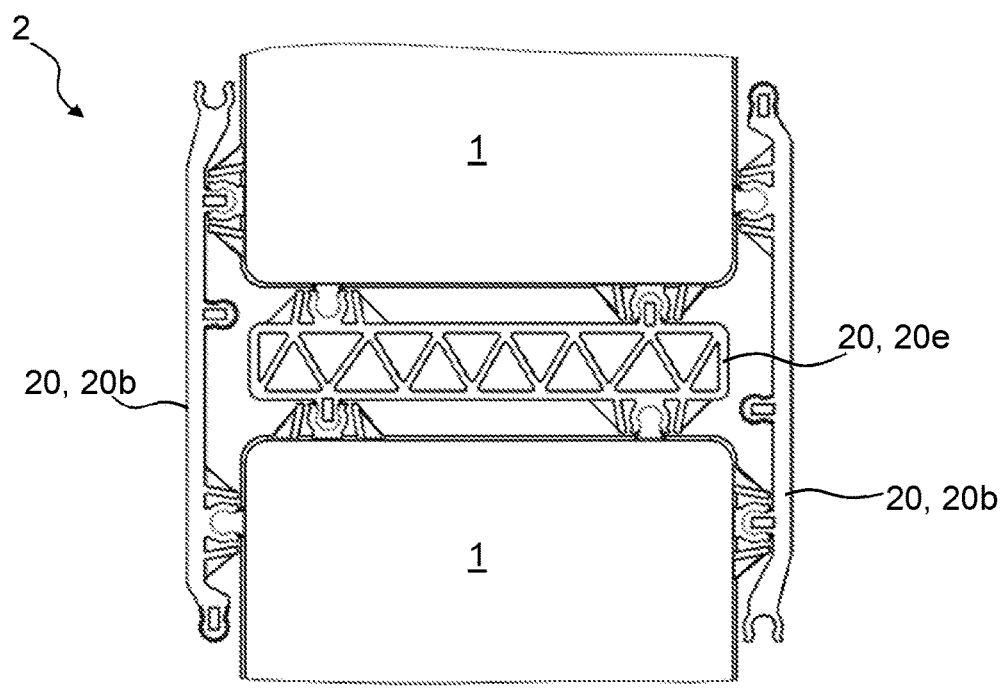
Figure 9:
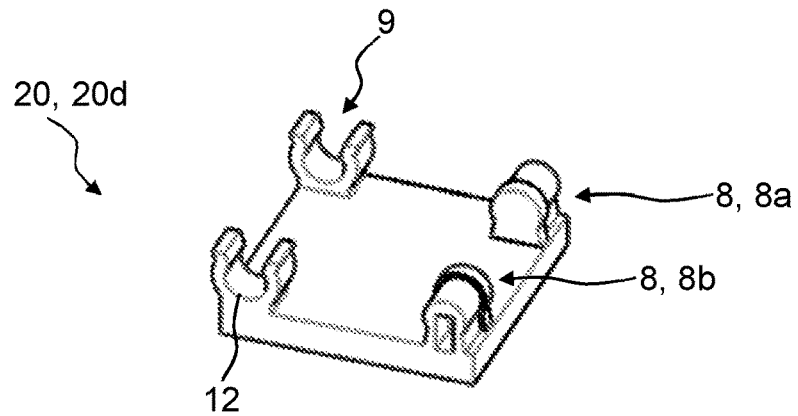
Figure 10:
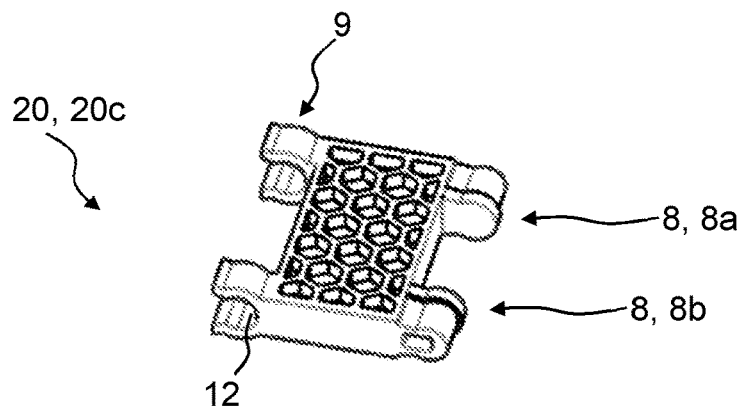

show various views of an antenna housing of the modular housing arrangement;

FIG. 2, 3A, 3B:

show a connecting plate and its arrangement on two antenna housings that are offset from one another by 180°;

FIG. 4A, 4B, 5:

show a direct connection of a plurality of antenna housings and, at the same time, the use of a reinforcing element and an L-bar connector;

FIG. 6: shows a double arrangement of 2×2 antenna housings which emit signals in two opposing directions;

FIG. 7, 8: show the use of a spacer;

FIG. 9: shows an embodiment of an L-bar connector;

FIG. 10: shows an embodiment of an intermediate connector;

FIGS. 11 to 13B:

show various embodiments of the modular housing arrangement; and

FIG. 14A to 14C:

show various embodiments of the modular housing arrangement, the individual antenna housings being arranged so as to be rotated relative to one another.

DETAILED DESCRIPTION OF EXAMPLE NONLIMITING EMBODIMENTS

Figure 1A:
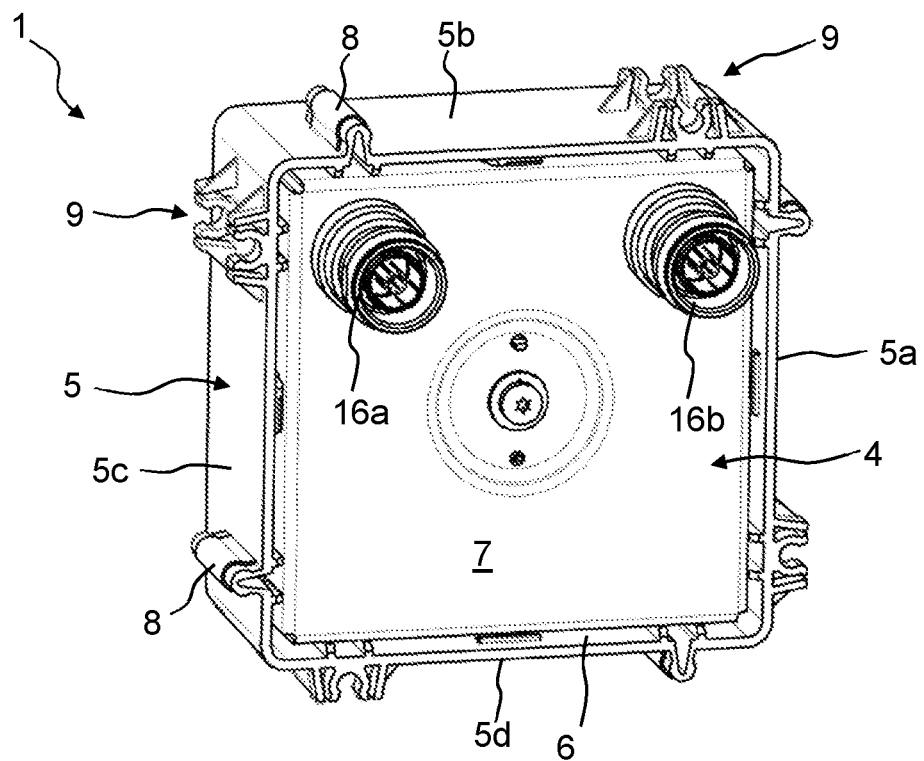
FIG. 1A to 1D.
Figure 1B:
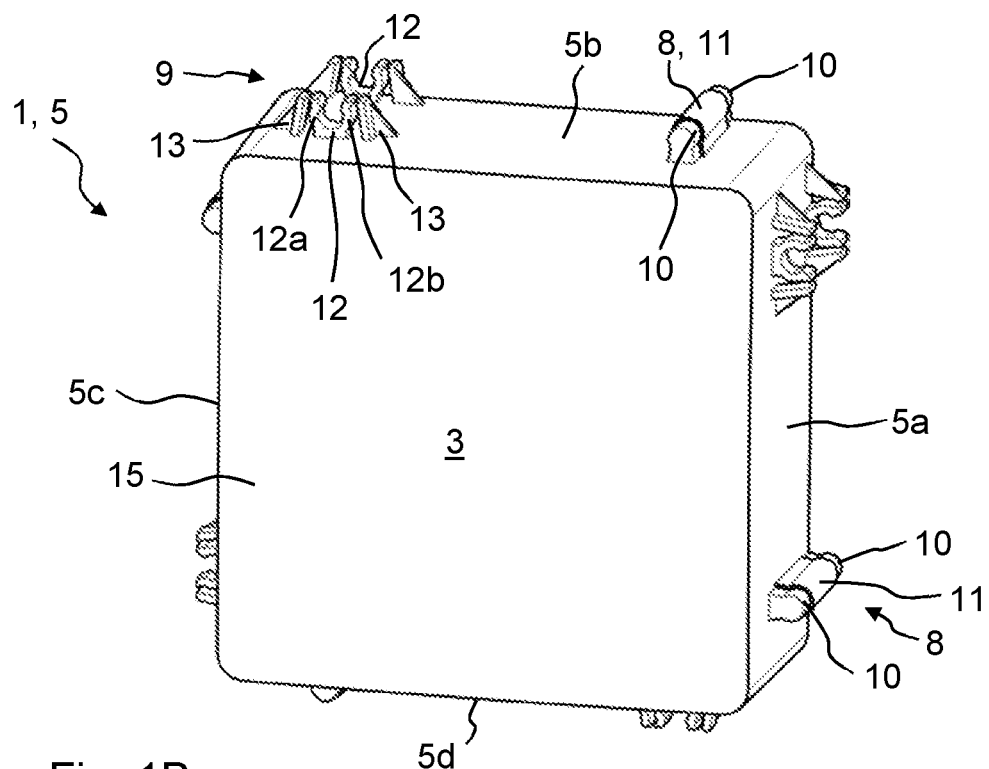

FIGS. 1A and 1B show various views of an antenna housing 1 of a modular housing arrangement 2. The antenna housing 1 comprises a front face 3 on the cover side and a front face 4 on the base side. A peripheral side wall 5 comprising a plurality of lateral surfaces 5a, 5b, 5c, 5d is arranged between the front face 3 on the cover side and the front face 4 on the base side, as a result of which a receiving space 6 is defined. At least one antenna 7 is or can be arranged in the receiving space 6. At least one male part 8 and one female part 9 of a positive and/or non-positive connection in the form of a snap connection are arranged on the peripheral side wall 5 so as to be offset from one another in the peripheral direction. The at least one male part 8 and the at least one female part 9 are designed to establish a detachable snap connection to a corresponding female or male part 9, 8, respectively, of at least one further antenna housing 1 and/or of at least one connecting element 20 (starting from FIG. 2).

Figure 14A:
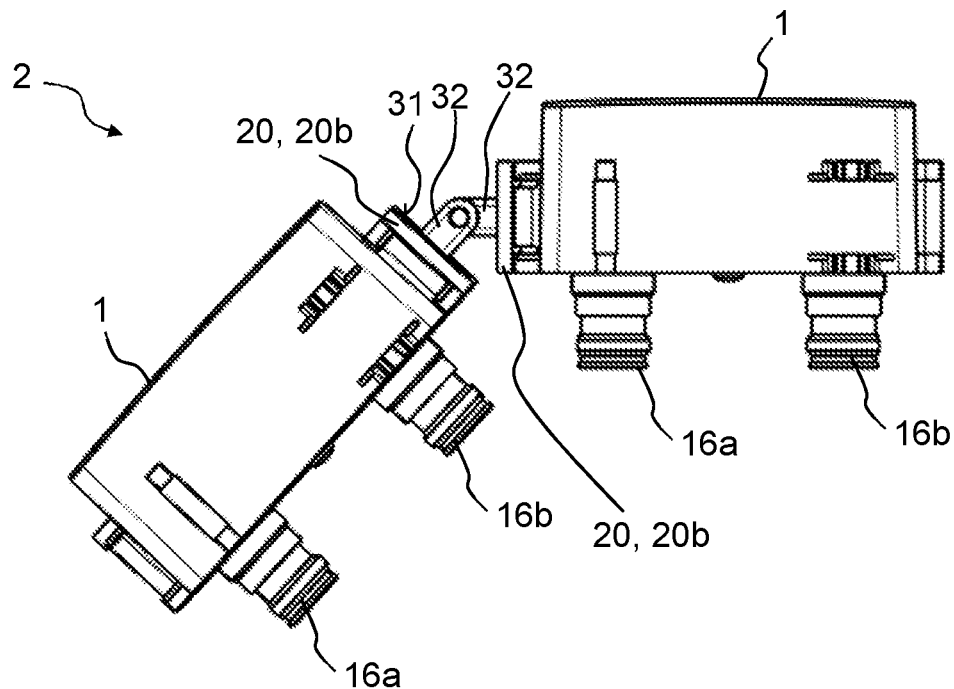
Figure 14B:
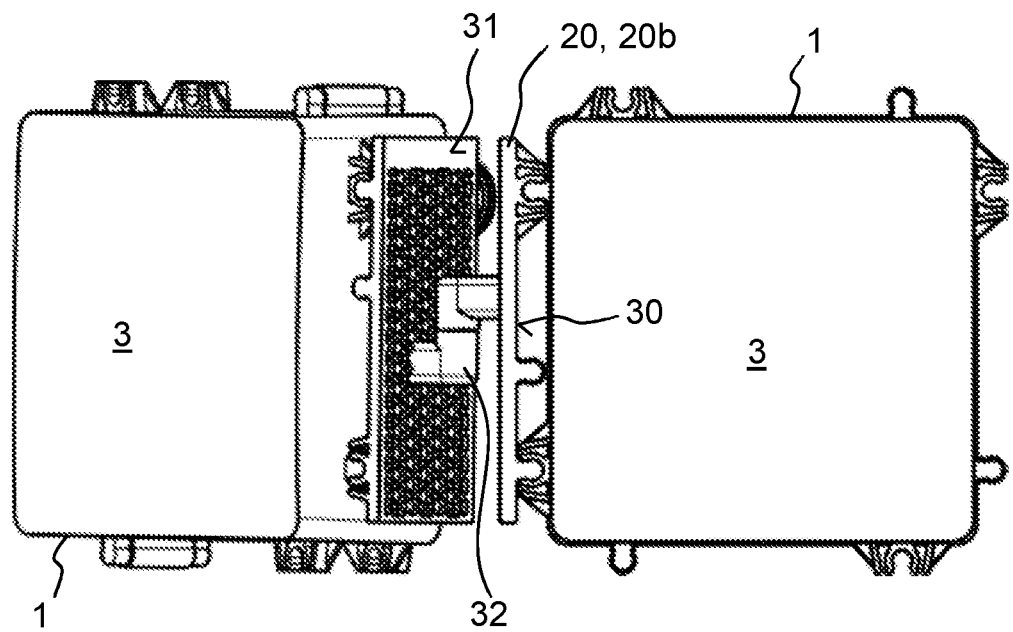
Figure 14C:
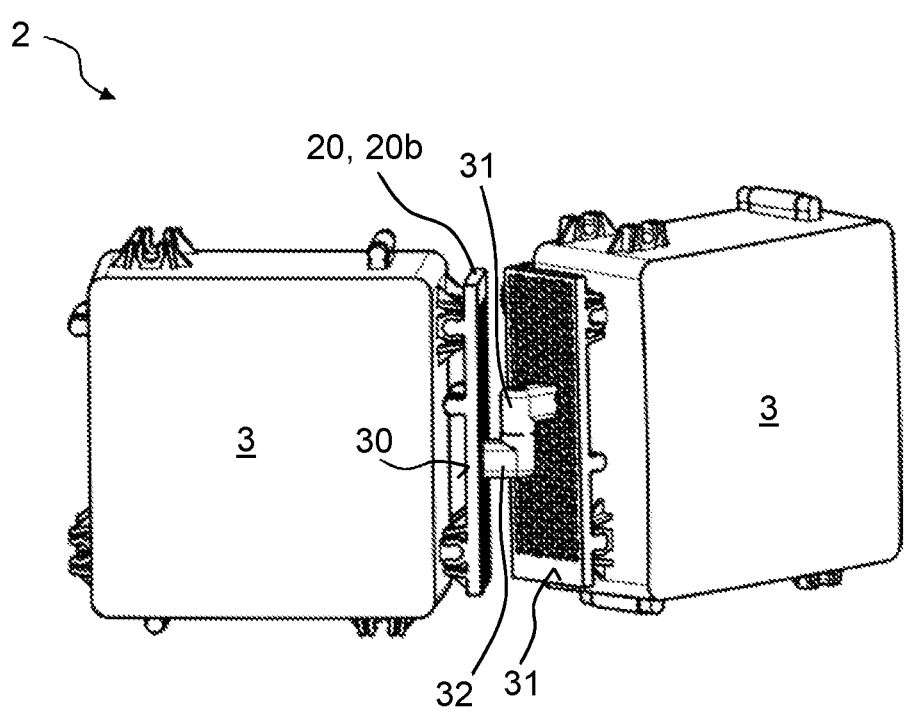

With the exception of FIG. 14A to 14C, only positive and/or non-positive connections in the form of snap connections or click connections are shown in the drawings. It is, however, clear that the positive and/or non-positive connections can also be sliding connections or plug-in connections or bayonet connections or hinged connections. A mixture of the different kinds of connections can also appear in the modular housing arrangement 2.

The at least one male part 8 is pin-shaped or approximately pin-shaped and is preferably an integral component of the antenna housing 1. The pin-shaped or approximately pin-shaped at least one male part 8 has a smaller diameter at its contact points 10 which can be or have been brought into contact with the female part 9 than in the points 11 which are axially adjacent thereto, as a result of which a relative axial displacement between the male part 8 and the female part 9 is prevented.

Preferably, all of the male parts 8 are designed identically to one another with respect to their arrangement and the dimensions of their contact points 10. Preferably, all of the male parts 8 of all of the antenna housings 1 altogether are designed identically to one another and are preferably arranged in each case at the same points on the various antenna housings 1.

With regard to FIG. 1B, the at least one male part 8 is arranged further away from the front face 3 on the cover side than from the front face 4 on the base side. It would also be possible for the male part 8 to be arranged at the same distance away from the front face 4 on the base side as from the front face 3 on the cover side. It could also be arranged closer to the front face 3 on the cover side. The same also applies to the at least one female part 9.

The at least one female part 9 is designed such that it can enter into a positive connection together with the male part 8. The at least one female part 8 consists of a receiving element 12 in the shape of a U and/or a bracket, or of two receiving elements 12 in the shape of a U and/or a bracket that are spaced apart from one another in the axial direction. Each receiving element 12 in the shape of a U and/or a bracket consists of two resilient retaining legs 12a, 12b, by means of which the at least one male part 8 can be or is held in a positive manner. The retaining legs 12a, 12b can be moved away from one another at least in part. The spacing between the retaining legs 12a, 12b is therefore changeable. The retaining legs 12a, 12b are resilient at least in part. When the male part 8 of the snap connection is inserted, the two retaining legs 12a, 12b of the female part 9 of the snap connection are pressed slightly apart from one another. So that the retaining legs 12a, 12b do not break off, additional snap protection elements 13 are preferably provided. These snap protection elements 13 are attached adjacently to the respective retaining legs 12a, 12b and limit the angle by which the retaining legs 12a, 12b can move apart from one another. In the simplest case, the snap protection elements 13 are designed as a protrusion. In this case, the snap protection elements 13 together with the retaining legs 12a, 12b are preferably formed integrally with the antenna housing 1.

In FIG. 1A and FIG. 1B, each lateral surface 5a, 5b, 5c, 5d of the peripheral side wall 5 comprises a male part 8 and a female part 9. The spacing between the male part 8 and the female part 9 is identical for all male and female parts 8, 9, respectively, of all of the antenna housings 1. The same also applies to the spacing between the individual contact points 10 of the male part 8. This spacing is identical for all the male parts 8, regardless of which objects they are attached to. This ensures that the individual components, such as the individual antenna housings 1, can be interconnected very simply.

The at least one antenna housing 1 is preferably in the shape of an n-gon where n=4, at least one male part 8 and at least one female part 9 of the snap connection being arranged on most or preferably on all of the n lateral surfaces 5a, 5b, 5c, 5d of the peripheral side wall 5 so as to be offset from one another in the peripheral direction. It would also be possible for this to be a pentagon or a hexagon, where n≥4. The arrangement as a rectangle is, however, the preferred variant.

In FIG. 1B, it can be seen that the antenna housing 1 is fully closed by a cover 15 on the front face 3 on the cover side. It is also possible for the cover 15 to only mostly close the front face 3 on the cover side. With regard to FIG. 1A, in contrast, it can be seen that the front face 4 on the base side is mostly or fully open. This allows the antenna 7 to be inserted. In this embodiment, the antenna 7 has two plug-in connections 16a, 16b, by means of which the antenna 7 can be connected to a superordinate device (for example, amplifier or filter). This superordinate device, which is not shown, is responsible for generating the high frequency signal and for supplying the antenna 7.

Figure 1C:
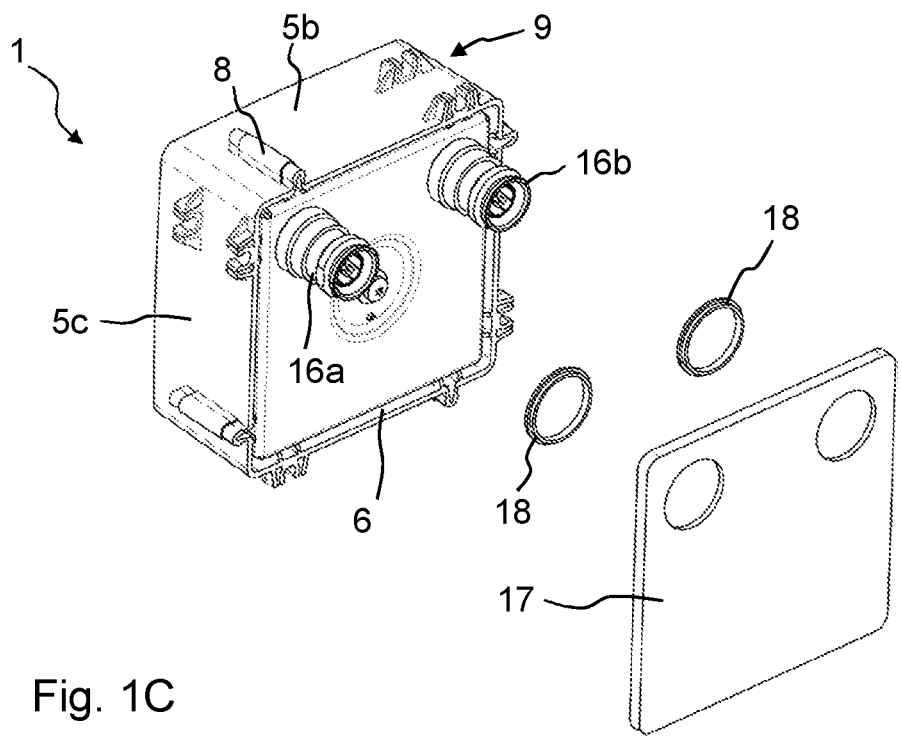
Figure 1D:
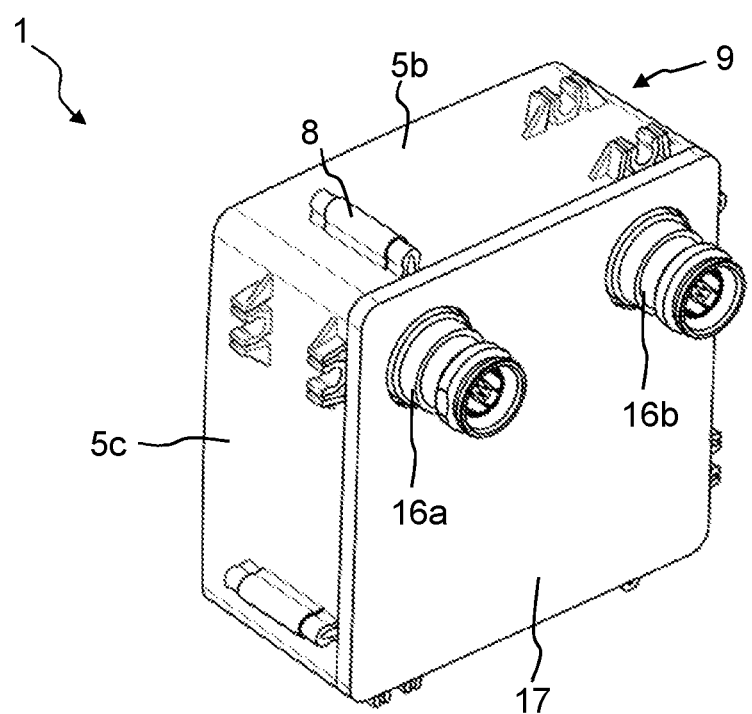

In FIG. 1C and FIG. 1D, it can be seen that the front face 4 on the base side can be closed by a further cover 17.

The respective plug-in connections 16a, 16b are passed through this further cover 17. Sealing rings 18 ensure that no moisture can penetrate into the receiving space 6 of the antenna housing 1. By attaching the further cover 17 and the sealing rings 18 to the plug-in connections 16a, 16b, the level of protection of the antenna housing 1 is increased.

The antenna housing 1 is less deep in the axial direction than it is wide and high.

Figure 2:
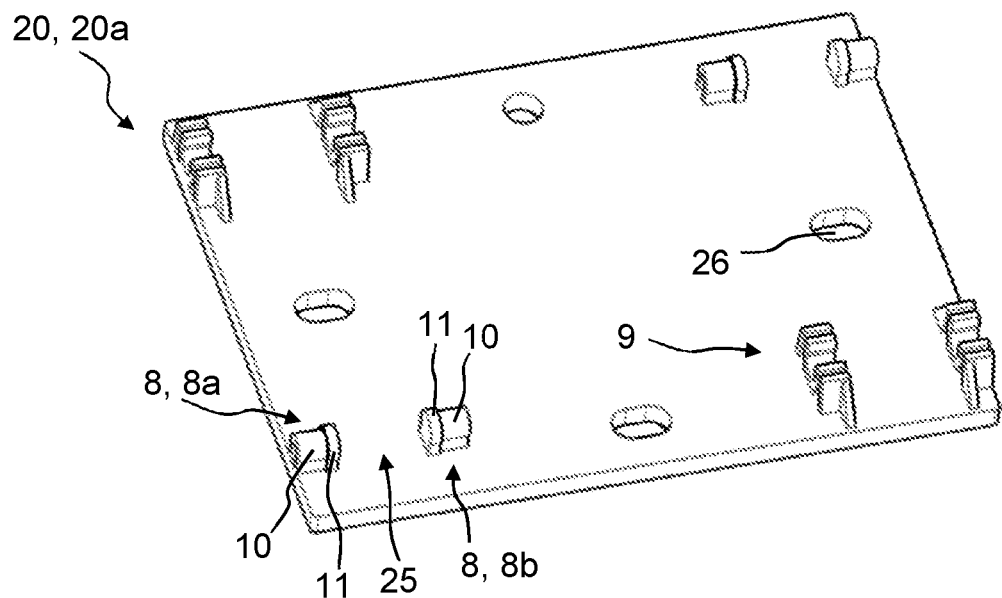
Figure 3A:
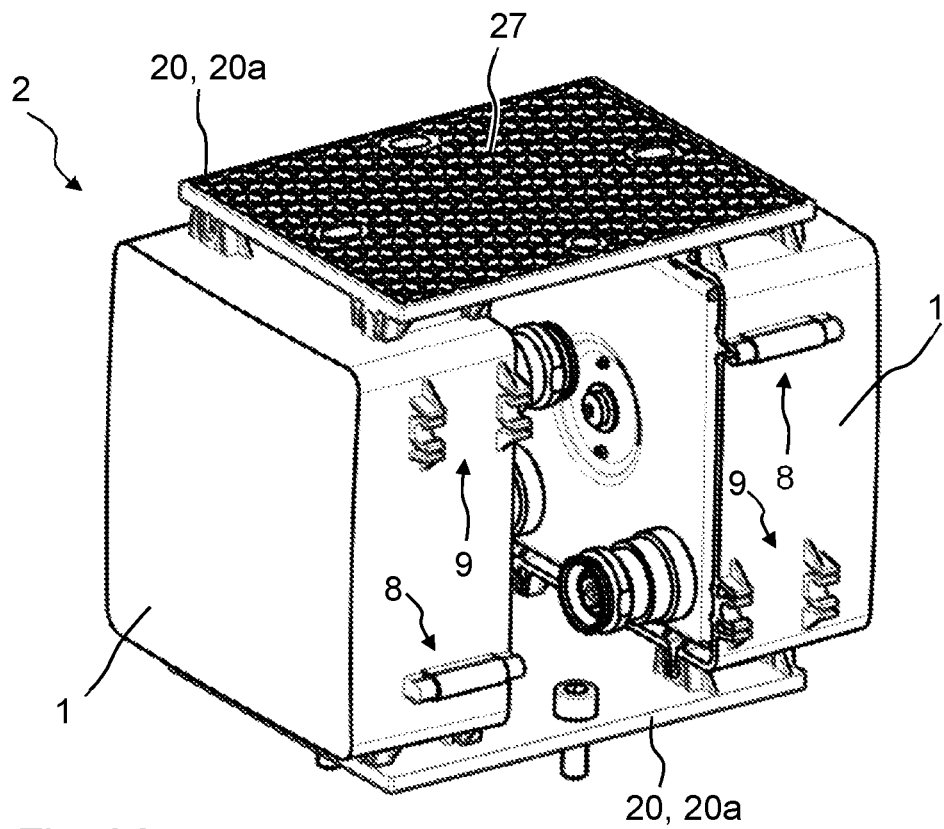

FIG. 2 shows a connection element 20 in the form of a connecting plate 20a. FIG. 3A shows the use of the connection place 20a. The connecting plate 20a is used when the front faces 4 of the base sides of two antenna housings 1 are arranged relative to one another and are oriented towards one another. Such a configuration is also called a back-to-back configuration. In this case, the radiation directions of both antenna housings 1 are arranged so as to be offset from one another by 180°. The connecting plate 20a fixes the two antenna housings 1 with regard to their alignment relative to one another. In FIG. 3A, two connecting plates 20a can be seen which are arranged perpendicularly to the two front faces 3 on the cover side. Each connecting plate 20a interconnects two lateral surfaces 5a, 5b, 5c, 5d of two antenna housings 1, the two lateral surfaces 5a, 5b, 5c, 5d lying in the same plane.

In FIG. 2, the connecting plate 20a comprises at least two male and two female parts 8, 9 of a snap connection. One male part 8 of the first antenna housing 1 engages in the female part 9 of the connecting plate 20a. One male part 8 of the second antenna housing 1 engages in the female part 9 of the connecting plate 20a. One male part 8 of the connecting plate 20a engages in one female part 9, respectively, of the first and second antenna housing 1. This means that the connecting plate 20a is fastened to each antenna housing 1 by means of at least two snap connections. The connecting plate 20a is preferably designed so as to be symmetrical with respect to a central point in the connecting plate 20a.

Adjacent to its contact points 10, the pin-shaped or approximately pin-shaped at least one male part 8 also has an edge 11 having a widened diameter. An interruption 25 is formed adjacently thereto, as a result of which the pin-shaped or approximately pin-shaped male part 8 is divided into two segments 8a, 8b that are separated from one another.

The connecting plate 20a is formed integrally with the male and female parts 8, 9. The male and female parts 8, 9 are preferably arranged in the corner region of the connecting plate 20a.

Furthermore, the connecting plate 20a has openings 26 for introducing a connecting screw. Using these openings 26, the connecting plate 20a can be fastened to a base body, such as to a surface of the "street furniture".

The surface 27 of the connecting plate 20a has a honeycomb-like or lattice-like structure in order to save material when producing the connecting plate 20a on the one hand and to increase stability on the other hand. Moreover, a design suitable for plastics material is used here, which allows uniform wall thicknesses and an optimum distribution of the material in the relevant component during the production of the part.

In the assembled state, the connecting plate 20a does not project beyond the front faces 4 on the cover side of the antenna housing 1. The antenna housings 1, which are arranged back-to-back, are spaced apart from one another by the connecting plate 20a such that the connection cables can still be connected. The connecting plate 20a can additionally have a through-opening, through which these connection cables can be passed.

Figure 3B:
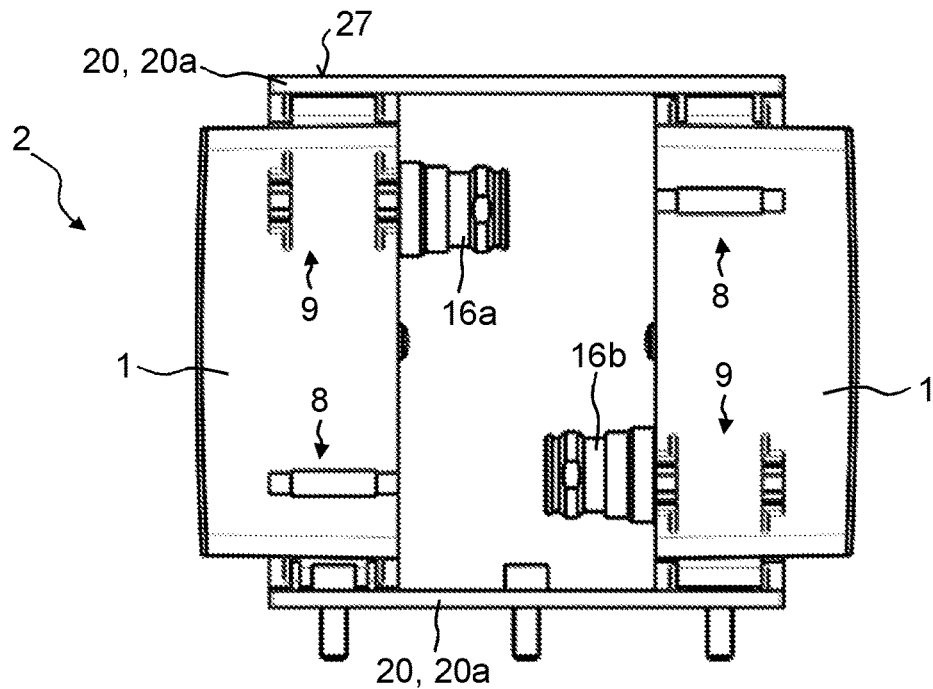

FIG. 3B is a side view of the modular housing arrangement 2 from FIG. 3A comprising two antenna housings 1 which are arranged back-to-back.

Figure 4A:
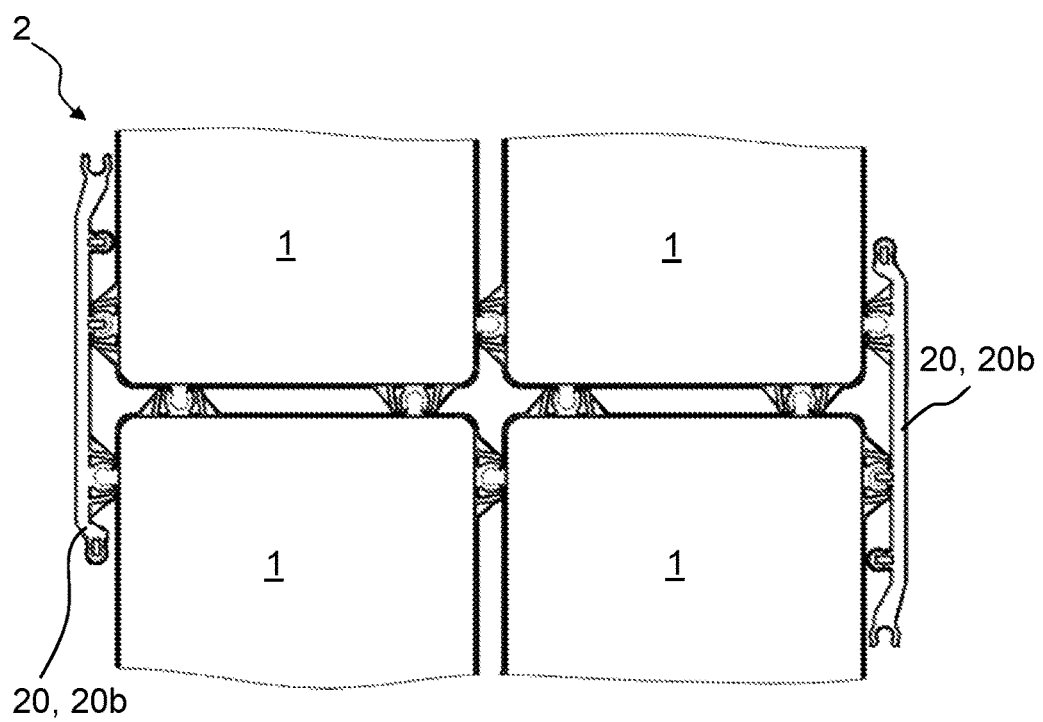

FIG. 4A is a further view, which illustrates how individual antenna housings 1 can be directly inter connected. The modular housing arrangement 2 from FIG. 4A, which is shown in overview in FIG. 4B, has a configuration of 2×2 antenna housings 1. Each antenna housing 1 is connected to two other antenna housings 1. There is a direct connection when the male or female parts 8, 9, respectively, of one antenna housing 1 engage directly in the corresponding female or male parts 9, 8, respectively, of another antenna housing 1, forming a snap connection. Such a case is shown in FIG. 4A.

The snap connections shown are annular snap connections. The individual antenna housings 1, in particular the front faces 3 on the cover side of the individual antenna housings 1, are arranged at an angle of 0° relative to one another. This means that the front faces 3 on the cover side of the individual antenna housings 1 lie in a common plane. In this case, the antennae 7 inside the individual antenna housings 1 radiate in approximately the same direction.

Figure 4B:
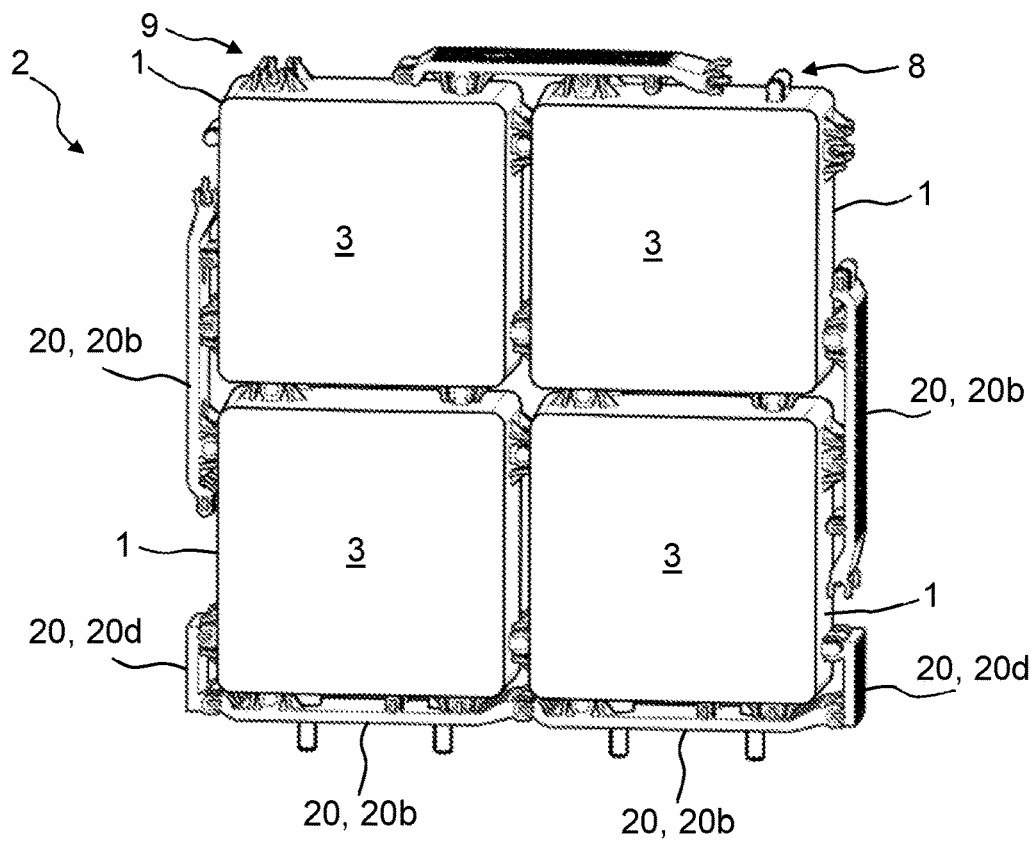

In FIG. 4A and FIG. 4B, connection elements 20 in the form of reinforcing elements 20b are also shown.

Figure 5:
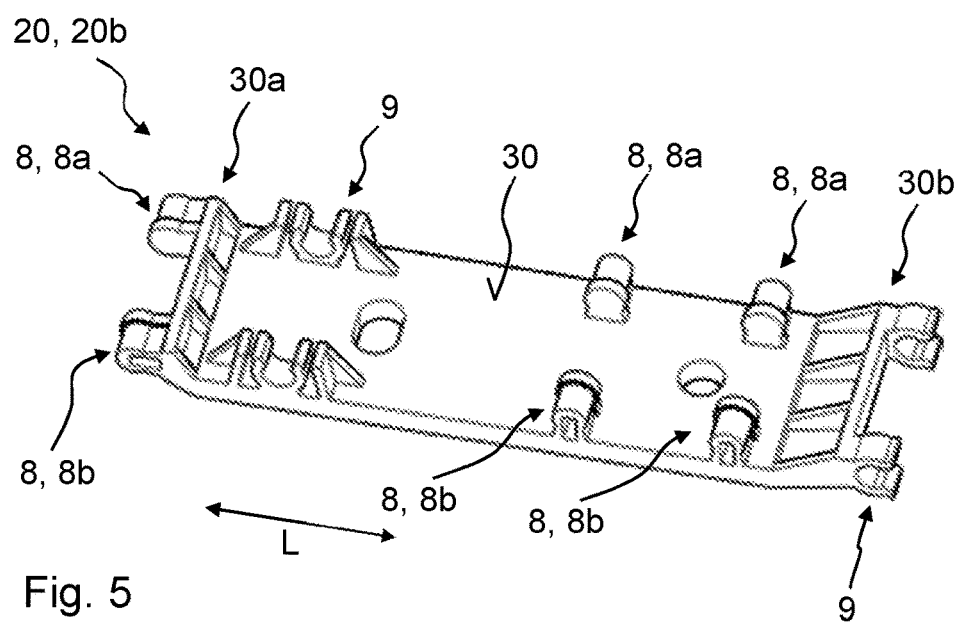

FIG. 5 is an enlarged view of such a reinforcing element 20b. On a first lateral surface 30, preferably only on precisely the first lateral surface 30, the reinforcing element 20b has at least one male part 8 and at least one female part 9 of a snap connection which are arranged over the length of the reinforcing element 20b so as to be offset from one another. In FIG. 4A, the reinforcing element 20b is connected to two antenna housings 1. For this purpose, the male part 8 of the reinforcing element 20b engages in a female part 9 of the first antenna housing 1. Correspondingly, a male part 8 of the second antenna housing 1 engages in a female part 9 of the reinforcing element 20b. The reinforcing element 20b therefore connects two lateral surfaces 5a, 5b, 5c, 5d of different antenna housings 1 which are in the same plane. This means that the female part 9 of the first antenna housing 1 and the male part 8 of the second antenna housing 1 lie in a common plane.

FIG. 4B also shows that the reinforcing element 20b is connected to just one lateral surface 5a, 5b, 5c, 5d of the antenna housing 1. In this case, the male part 8 of the reinforcing element 20b is inserted into a female part 9 of the antenna housing 1 and furthermore a male part 8 of the same antenna housing 1 is inserted into a female part 9 of the reinforcing element 20b. Such a reinforcing element 20b is shown in the lower region of the modular housing arrangement 2 from FIG. 4B.

Furthermore, the at least one reinforcing element 20b from FIG. 5 has a male part 8 on a first front face 30a, whereas a female part 9 of a snap connection is formed on a second front face 30b which is arranged opposite the first front face 30a. The male and female parts 8, 9, respectively, which are formed on one of the two front faces 30a, 30b of the reinforcing element 20b are arranged so as to be offset by an angle of approximately 90° from the male and female parts 8, 9, respectively, which are arranged on the first lateral surface 30 of the reinforcing element 20b. As explained with regard to FIG. 2, the male parts 8 consist of two different segments 8a, 8b.

In the event that the reinforcing element 20b is connected, by means of its male and female parts 8, 9 which are formed on its first lateral surface 30, to just one lateral surface 5a, 5b, 5c, 5d of precisely one antenna housing 1, the male and female parts 8, 9, respectively, which are formed on the front faces 30a, 30b, can engage in the corresponding female and male parts 9, 8, respectively, which are formed on the front face in another reinforcing element 20b which is connected to precisely one other antenna housing. Such a case is shown in the lower region of the modular housing arrangement 2 from FIG. 4B. The two reinforcing elements 20b, which are interconnected, lie in a common plane and are each connected to precisely one antenna housing 1.

Figure 12:
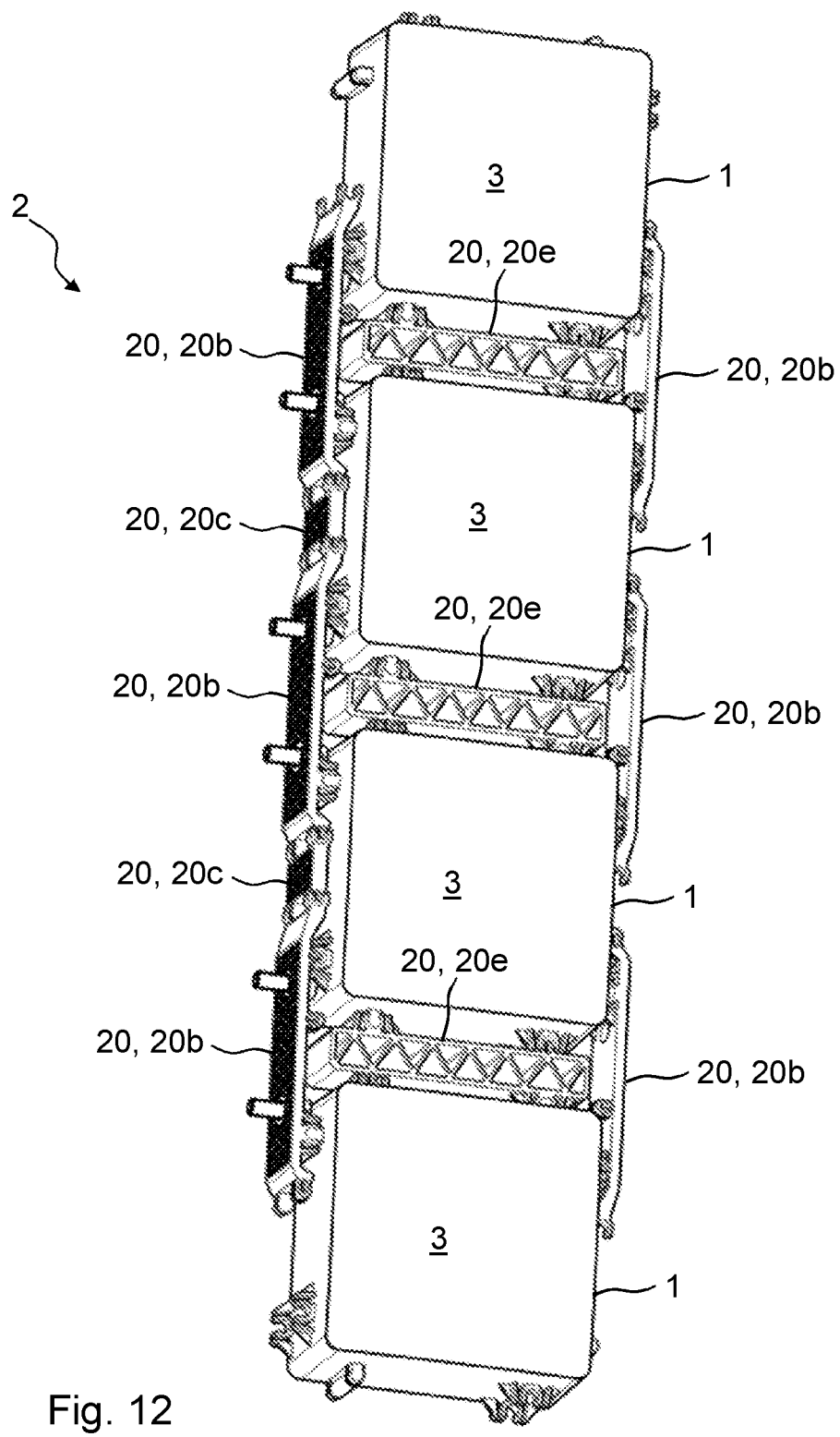

In FIG. 12, which likewise shows a modular housing arrangement 2, the antenna housings 1 of which are arranged in a configuration of 4×1, there is another additional connecting element 20 in the form of an intermediate connector 20c. Such an intermediate connector 20c is shown in FIG. 10. The intermediate connector 20c has a male and a female part 8, 9 on each of the two front faces. In the case of an indirect connection, which will be described below, between two antenna housings 1, a direct connection between two reinforcing elements 20b is not possible. The male part 8 on the front face of one reinforcing element 20b engages in the at least one female part 9 of the intermediate connector 20c, the at least one male part 8 of the intermediate connector 20c engaging in the female part 9 on the front face of the other reinforcing element 20b.

Both the intermediate connector 20c and the reinforcing element 20b can have a honeycomb-like or lattice-like structure on the surface thereof on which no male or female part 8, 9 is arranged.

The intermediate connector 20c has a shorter length than the reinforcing element 20b. The intermediate connector 20c has a rectangular basic structure.

When the reinforcing element 20b is connected to only one lateral surface 5a, 5b, 5c, 5d of an antenna housing 1, the front face 30a, 30b of said reinforcing element, and therefore the male and female parts 8, 9 attached thereto, projects beyond this lateral surface 5a, 5b, 5c, 5d.

In FIG. 4B, a connecting element 20 in the form of an L-bar connector 20d is also shown. FIG. 9 is an enlarged view of the L-bar connector 20d. The L-bar connector 20d has a rectangular basic structure, a male and a female part 8, 9 being attached thereto. Both parts are in each case attached to the corners of the L-bar connector 20d. Both parts 8, 9 are attached to the same side of the L-bar connector 20d. The male and female part 8, 9, respectively, of the at least one L-bar connector 20d engages in the corresponding female and male part 8, 9, respectively, of the reinforcing element 20b, which are arranged on its front face 30a, 30b. In addition, the other female and male part 9, 8, respectively, of the L-bar connector 20d engages in the male or female part 8, 9 of a further lateral surface 5a, 5b, 5c, 5d of the peripheral side wall 5 of the antenna housing 1 which is directly adjacent to the lateral surface 5a, 5b, 5c, 5d of the peripheral side wall 5 on which the reinforcing element 20b engages. A surface of the L-bar connector 20d on which the male and female part 8, 9, respectively, is not arranged has a honeycomb-like or lattice-like structure.

FIG. 6 shows a modular housing arrangement 2 which comprises a plurality of antenna housings 1, the antenna housings 1 being arranged in a 2×2 configuration and a further 2×2 configuration of antenna housings 1 being arranged in a back-to-back configuration relative to this configuration. This means that four antennae radiate in a first direction and four antennae radiate in a second direction in each case. A plurality of connecting plates 20a is used in order to fix the individual antenna housings 1, which are arranged back-to-back, to one another.

Figure 8:
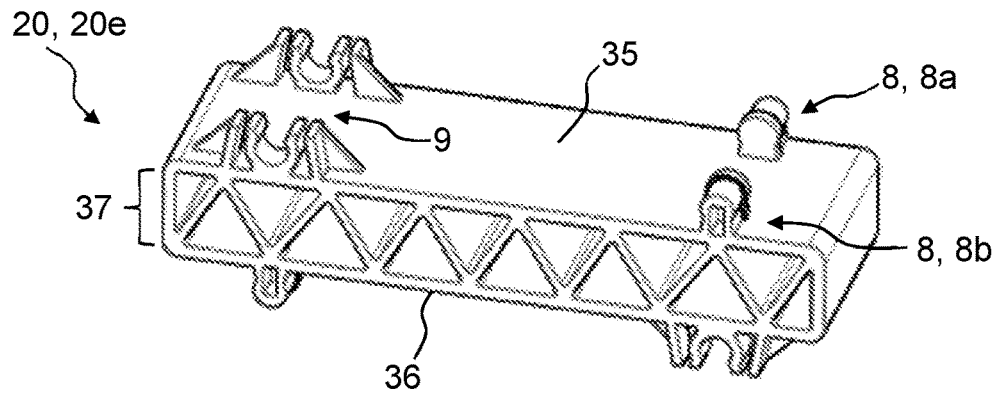

FIG. 7 is a further schematic view showing an indirect connection of two antenna housings 1. In this case, the at least one connecting element 20 is a spacer 20e. FIG. 8 is an enlarged view of this spacer 20e. The spacer 20e has two opposing lateral surfaces 35, 36, at least one male part 8 and at least one female part 9 of a snap connection being arranged so as to be offset from one another over the length of each lateral surface 35, 36. Both lateral surfaces 35, 36 of the spacer 20e are spaced apart from one another by an integral intermediate part 37. In a lateral plan view, the integral intermediate part has a honeycomb-like or lattice-like structure. At least one male part 8 of the first antenna housing 1 engages in a corresponding female part 9 on the first side 35 of the spacer 20e. At least one male part 8 of the second antenna housing 1 engages in a corresponding female part 9 on the second side 36 of the spacer 20e. Furthermore, at least one male part 8 on the first side 35 of the spacer 20e engages in a corresponding female part 9 on the first antenna housing 1. The same also applies to at least one male part 8 on the second side 36 of the spacer 20e which engages in a corresponding female part 9 on the second antenna housing 1, as a result of which both antenna housings 1 are indirectly interconnected.

FIGS. 11, 12, 13A and 13B likewise show modular housing arrangements 2 which comprise a spacer 20e, by means of which two antenna housings 1 are indirectly interconnected. A spacer 20e is used, for example, when no MIMO operation is to be achieved. This would be the case, for example, if the two interconnected antenna housings 1 were to be operated by different mobile communications providers. In this case, interference between the individual antennae 7 is reduced by the greater spacing thereof from one another.

Figure 11:
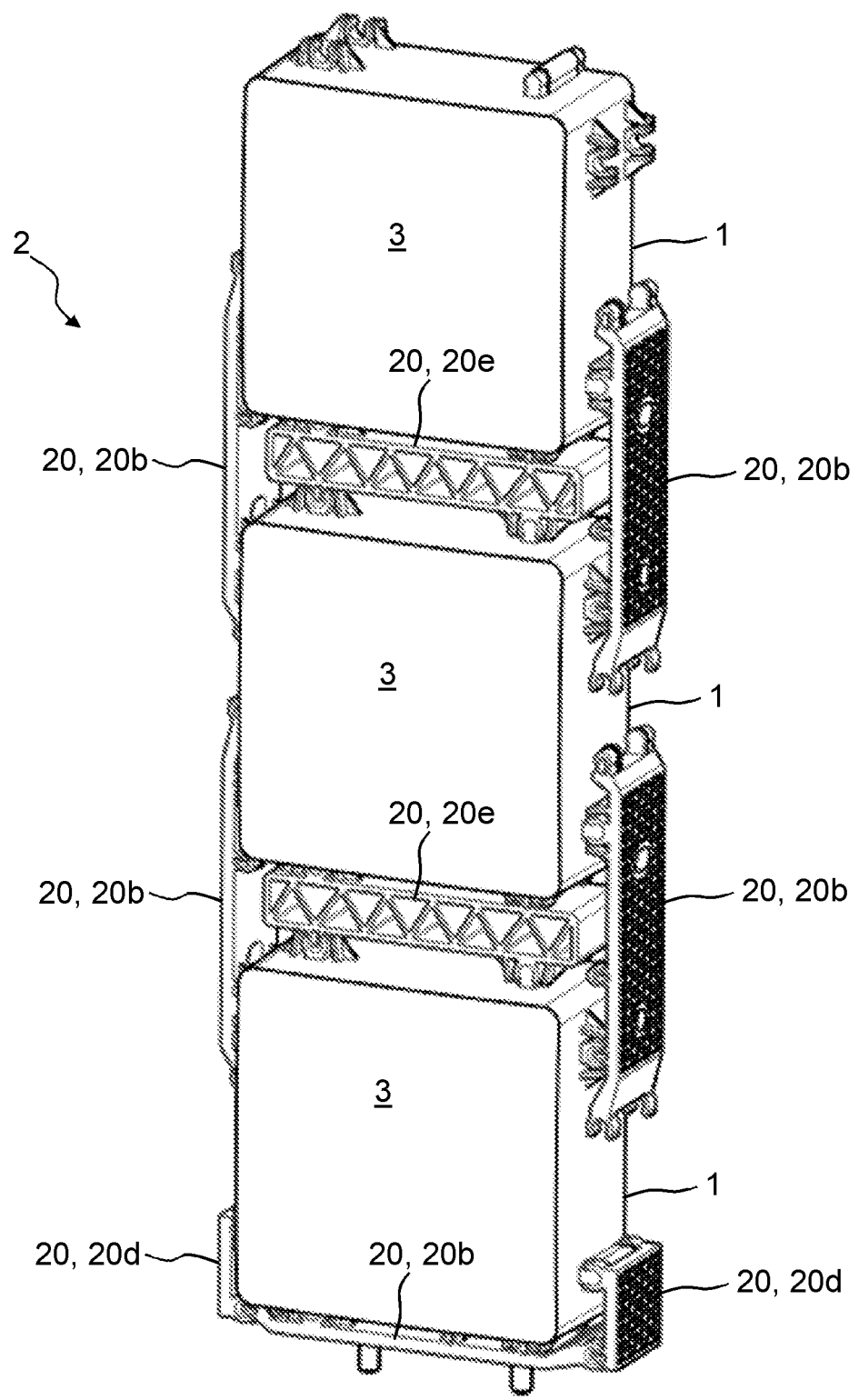
Figure 13A:
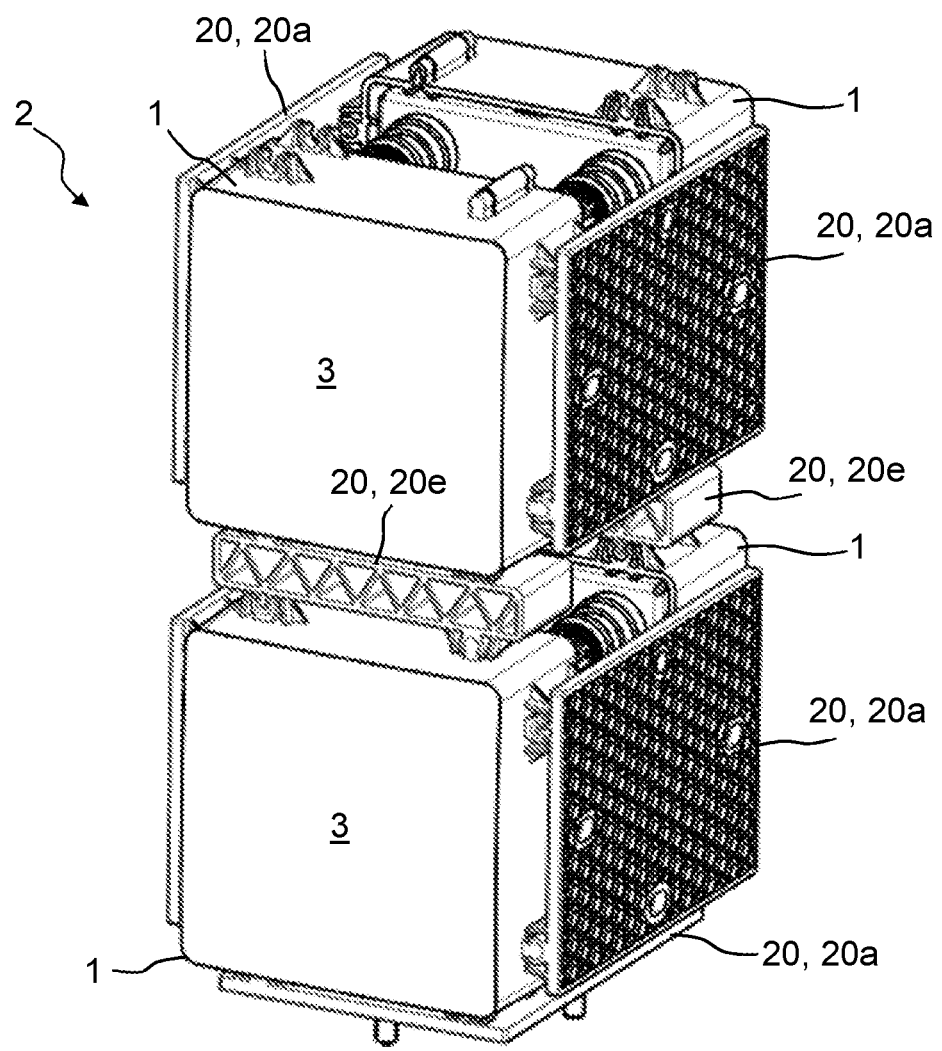
Figure 13B:
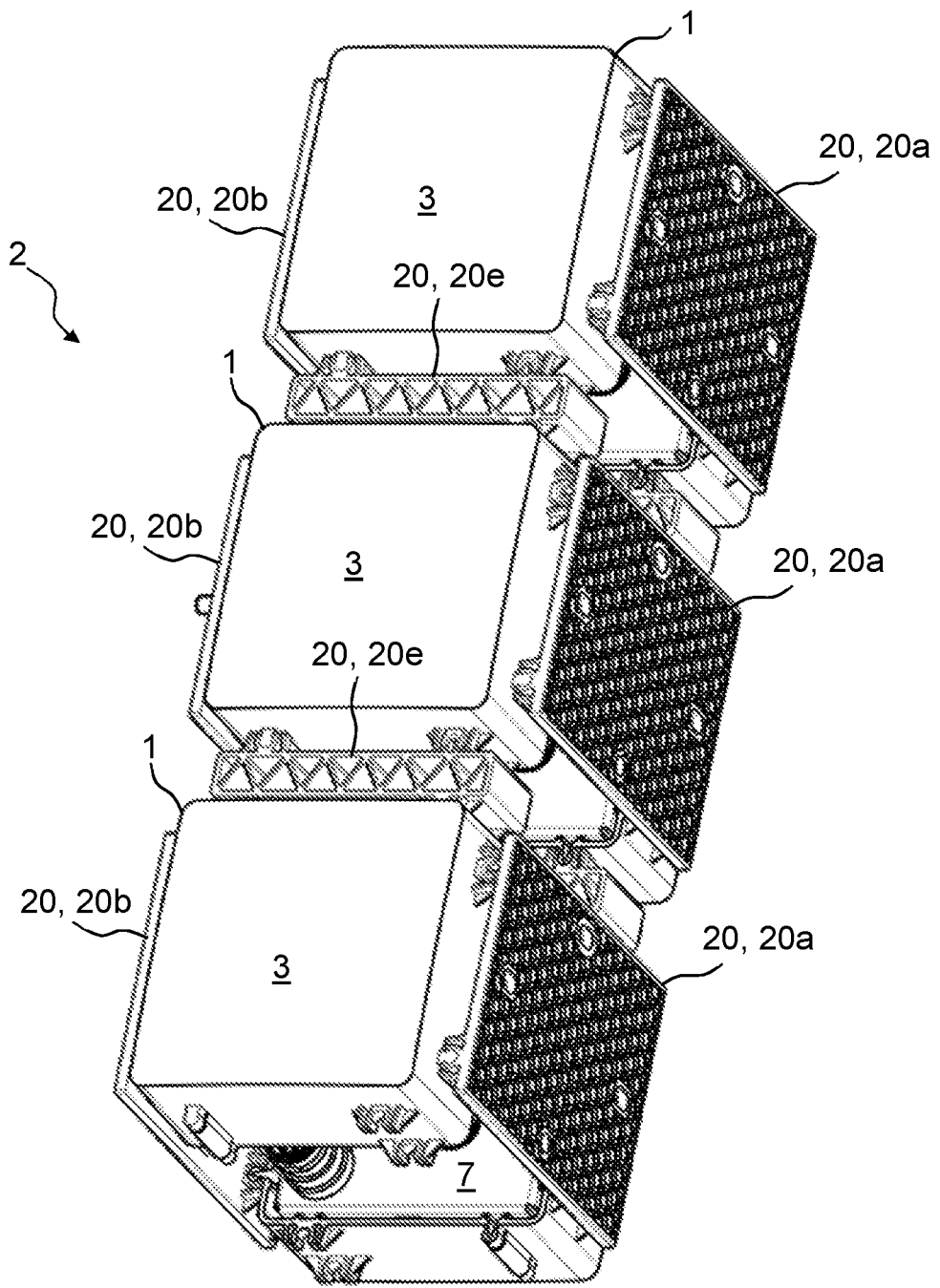

In FIG. 11, the antenna housings 1 have a 3×1 configuration. FIG. 12 is a 4×1 configuration. FIG. 13A is a 2×–1 configuration which is arranged back-to-back with a further 2×1 configuration. FIG. 13B is a 3×1 configuration which is arranged back-to-back with a further 3×–1 configuration. It should be noted here that as many antenna housings 1 as desired can be interconnected in this manner. A×B configurations where A and B≥1 would therefore be possible, which configurations could optionally be arranged back-to-back with a further C×D configuration where C and D≥1. An offset of 45° would also be possible.

FIG. 7 likewise shows the use of the reinforcing element 20b. The reinforcing element 20b is preferably a "universal" reinforcing element. This means that the reinforcing element 20b can always connect two lateral surfaces 5a, 5b, 5c, 5d of different antenna housings 1 even if these antenna housings 1 are indirectly or directly interconnected. For this purpose, the reinforcing element 20b comprises, on the first lateral surface 30, at least two male and/or female parts 8, 9 of a snap connection that are arranged so as to be offset from one another. FIG. 5 shows two male parts 8 of a snap connection that are offset from one another. Depending on whether the two antenna housings 1, the lateral surfaces 5a, 5b, 5c, 5d of which are to be interconnected by the reinforcing element 20b, are interconnected indirectly or directly, one or other of the at least two, in this case male, parts 8 which are arranged so as to be offset from one another over the length L, engages in the relevant mating part. In the event that the two antenna housings 1 are interconnected only indirectly, the male part 8 on the first lateral surface 30 of the reinforcing element 20b engages in a female part 9 on the lateral surface 5a, 5b, 5c, 5d of the antenna housing 1 which is arranged closer to a front face 30a, 30b of the reinforcing element 20b. In the case of a direct connection of the two antenna housings 1, the male part 8 of the snap connection which is further away from a front face 30*a*, 30*b* of the reinforcing element 20*b* is used. This would, of course, also apply if there were two female parts 9 and only one male part 8.

In FIG. 14A to 14C, a modified reinforcing element 20*b* is used. This reinforcing element 20*b* has at least one coupling part 32 of a positive and/or non-positive connection on it second lateral surface 31 which is opposite the first lateral surface 30. This coupling part 32 is brought into contact with a coupling part 32 of a positive and/or non-positive connection in another reinforcing element 20*b*. Both coupling parts 21 are rotatable relative to one another in one axis. As a result, both reinforcing elements 20*b* are rotatable relative to one another over a specific angle range in fixed angle steps or continuously by means of the two interconnected parts 32. The coupling part 32 of a positive and/or non-positive connection is hook-shaped, the coupling to the other coupling part 32 being formed on the free end in each case. As a result, the antenna housings 1 can be rotated relative to one another preferably by 120°. The axis of rotation extends through the respective free ends of the two coupling parts 32. This can, for example, be a plug-in connection in this case.

A plurality of connecting elements 20 can be used, which can be selected from the number of described connecting elements 20, i.e. the connecting plate 20*a*, the reinforcing element 20*b*, the intermediate connector 20*c*, the L-bar connector 20*d* or the spacer 20*e*. In this case, as many of these connecting elements 20 as desired can be used in any desired combination. All of the connecting elements 20 are preferably formed integrally. Both the antenna housing 1 and the connecting elements 20 preferably consist of a plastics material.

The connecting elements 20 preferably also attach the modular housing arrangement 2 to an attachment plate (not shown) or to the "street furniture" itself. For this purpose, the connecting elements 20 comprise appropriate openings through which a screw connection can be passed. It is also possible for the individual connecting elements 20 to have a thread.

The entire modular housing arrangement 2 preferably comprises an outer housing (not shown) which surrounds all of the antenna housings 1 together with the associated connecting elements 20. This outer housing is preferably watertight.

It is also possible for the at least one antenna housing 1 to be attachable by means of the at least one male and female part 8, 9 of the snap connection to corresponding parts of a base structure and/or carrier plate which are part of a building structure, in particular part of the "street furniture".

Each type of connecting element 20 is preferably a different colour. The antenna housing 1 in turn is preferably a different colour compared with the connecting elements 20. As a result, errors in assembling the modular housing arrangement can be prevented. The different types of connecting elements 20 are the connecting plate 20*a*, the reinforcing element 20*b* or the modified reinforcing elements 20*b* comprising the coupling part 32, the intermediate connector 20*c*, the L-bar connector 20*d* and the spacer 20*e*.

The invention is not limited to the embodiments described. Within the scope of the invention, all the features described and/or illustrated can be combined with one another as desired.

The invention claimed is:

1. Modular housing arrangement for antennae comprising:
    at least one antenna housing comprising a front face on a cover side, a front face on a base side and a peripheral side wall between the front face on the cover side and the front face on the base side that comprises a plurality of lateral surfaces, as a result of which a receiving space is defined;
    at least one antenna is or can be arranged in the receiving space;
    at least one male and one female part of a positive and/or non-positive connection are arranged on the peripheral side wall;
    the at least one male part and the at least one female part being designed to establish a detachable positive and/or non-positive connection to a corresponding female and male part, respectively, of at least one further antenna housing and/or of at least one connecting element.

2. Modular housing arrangement according to claim 1, wherein:
    the male and the female part of the positive and/or non-positive connection are arranged on the peripheral side wall of the at least one antenna housing so as to be offset from one another in the peripheral direction.

3. Modular housing arrangement according to claim 1, wherein:
    the positive and/or non-positive connection comprises a snap connection or a sliding connection or a plug-in connection or a bayonet connection or a hinged connection or consists of such a connection.

4. Modular housing arrangement according to claim 3, wherein:
    the at least one male part is pin-shaped or approximately pin-shaped; and
    the at least one female part consists of a receiving element in the shape of a U and/or a bracket, or of at least two receiving elements in the shape of a U and/or a bracket that are spaced apart from one another in the axial direction, each receiving element in the shape of a U and/or a bracket consisting of two resilient retaining legs, by means of which the at least one male part can be or is held in a positive manner.

5. Modular housing arrangement according to claim 4 wherein:
    the pin-shaped or approximately pin-shaped at least one male part has a smaller diameter at its contact points which can be or have been brought into contact with the female part than at the points which are axially adjacent thereto, as a result of which a relative axial displacement between the male part and the female part is prevented; or
    the pin-shaped or approximately pin-shaped at least one male part has an interruption adjacent to its contact points which can be or have been brought into contact with the female part, as a result of which two segments, which are separated from one another, are formed.

6. Modular housing arrangement according to claim 5, wherein:
    all of the male parts are designed identically to one another at least with respect to the arrangement and to the dimensions of their contact points.

7. Modular housing arrangement according to claim 4, wherein:
    the at least one female part has one or at least two snap protection elements which prevent overstretching of the first and/or second retaining leg when the male part is clipped in and/or out.

8. Modular housing arrangement according to claim 3, wherein:
    the snap connection comprises an annular snap connection or consists of an annular snap connection.

9. Modular housing arrangement according to claim 1, wherein:
the at least one male part is formed integrally or of multiple parts; and
the at least one antenna housing is formed integrally with the male and female parts which are arranged thereon.

10. Modular housing arrangement according to claim 1, wherein:
the at least one male part and the at least one female part are:
a) arranged further away from the front face on the base side than from the front face on the cover side; or
b) arranged further away from the front face on the cover side than from the front face on the base side; or
c) arranged so as to be equidistant from the front face on the base side and from the front face on the cover side.

11. Modular housing arrangement according to claim 1, wherein:
the at least one antenna housing is in the shape of an n-gon where n≥4, at least one male part and at least one female part of the positive and/or non-positive connection being arranged on most or all of the n lateral surfaces of the peripheral side wall.

12. Modular housing arrangement according to claim 1, wherein:
the at least one antenna housing is mostly or fully closed on the front face on the cover side by a cover; and/or
the at least one antenna housing is mostly or fully open on the front face on the base side or is closed by a further cover.

13. Modular housing arrangement according to claim 1, wherein:
the at least one antenna housing and/or the at least one connecting element consists of or comprises plastics material.

14. Modular housing arrangement according to claim 1, wherein:
the modular housing arrangement comprises at least two antenna housings which can be or are indirectly or directly interconnected by means of their respective male and female parts of the positive and/or non-positive connection; and/or
planes of the front faces on the cover side of the individual antenna housings are arranged at an angle of 0°, 90° and/or 180° to one another or at an angle in between.

15. Modular housing arrangement according to claim 14, wherein:
at least one male part of each of the two antenna housings engages in a corresponding female part on the other antenna housing, as a result of which both antenna housings are directly interconnected by the positive and/or non-positive connection.

16. Modular housing arrangement according to claim 14, wherein:
the at least one connecting element consists of a spacer or comprises a spacer;
the spacer has two opposing lateral surfaces, at least one male part and at least one female part of a positive and/or non-positive connection being arranged on each lateral surface so as to be offset from one another;
both lateral surfaces of the spacer are spaced apart from one another by an integral intermediate part;
at least one male part of the first antenna housing engages in a corresponding female part on the first side of the spacer;
at least one male part of the second antenna housing engages in a corresponding female part on the second side of the spacer;
at least one male part on the first side of the spacer engages in a corresponding female part on the first antenna housing; and
at least one male part on the second side of the spacer engages in a corresponding female part on the second antenna housing, as a result of which both antenna housings are indirectly interconnected.

17. Modular housing arrangement according to claim 14, wherein:
the at least one connecting element comprises at least one reinforcing element or consists of at least one reinforcing element;
the reinforcing element has, on a first lateral surface, at least one male part and at least one female part of a positive and/or non-positive connection which are arranged so as to be offset from one another;
the reinforcing element is
a) connected to both antenna housings, in that the male part of the reinforcing element engages in a female part of the first antenna housing and in that a male part of the second antenna housing engages in a female part of the reinforcing element, the female part of the first antenna housing and the male part of the second antenna housing lying in a common plane;
and/or
b) connected to a lateral surface of the antenna housing, in that the male part of the reinforcing element engages in a female part of the antenna housing and in that a male part of the antenna housing engages in a female part of the reinforcing element.

18. Modular housing arrangement according to claim 17, wherein:
the at least one reinforcing element has a male part of a positive and/or non-positive connection on a first front face and a female part of a positive and/or non-positive connection on a second front face.

19. Modular housing arrangement according to claim 18, wherein:
the modular housing arrangement comprises at least two or at least three antenna housings which are arranged on top of or next to one another and are indirectly or directly interconnected, the front faces on the cover side of the antenna housing preferably lying in one plane;
two reinforcing elements, which lie in a common plane and are connected to one antenna housing or two antenna housings, are additionally interconnected in that:
a) the male part on the front face of one reinforcing element engages in the female part of the front face of the other reinforcing element, establishing a positive and/or non-positive connection; or
b) the male part on the front face of one reinforcing element engages in at least one female part of an intermediate connector, at least one male part of the intermediate connector engaging in the female part on the front face of the other reinforcing element.

20. Modular housing arrangement according to claim 17, wherein:
on a second lateral surface which is opposite the first lateral surface the reinforcing element has at least one coupling part of a positive and/or non-positive connection which can be brought into contact with a coupling part of a positive and/or non-positive connection in another reinforcing element, the two reinforcing elements being rotatable relative to one another over a specified angle range in fixed angle steps or continuously by means of the two interconnected coupling parts.

21. Modular housing arrangement according to claim 17, wherein:
   the at least one connecting element comprises an L-bar connector or consists of such;
   the at least one L-bar connector has a male part of a positive and/or non-positive connection on a first front face and a female part of a positive and/or non-positive connection on a second front face;
   the male or female part, respectively, on the first or second front face of the at least one L-bar connector engages in the female or male part, respectively, of the reinforcing element which is arranged on the first or second front face thereof; and
   the female or male part, respectively, on the second or first front face of the L-bar connector engages in the male or female part on a further lateral surface of the peripheral side wall of the antenna housing which is adjacent to the lateral surface of the peripheral side wall on which the reinforcing element engages.

22. Modular housing arrangement according to claim 17, wherein:
   the reinforcing element has, on the first lateral surface, at least two male or female parts of a positive and/or non-positive connection that are arranged so as to be offset from one another over the length; and
   depending on whether the two antenna housings are interconnected indirectly or directly, one or other of the at least two male or female parts engages in the relevant mating part.

23. Modular housing arrangement according to claim 14, wherein:
   at least two antenna housings are arranged such that their front faces on the base side are spaced apart from one another and oriented towards one another;
   the at least one connecting element comprises a connecting plate or consists of such, which plate is arranged perpendicularly to the two front faces on the cover side; and
   the connecting plate is connected to the two antenna housings by a positive and/or non-positive connection.

24. Modular housing arrangement according to claim 23, wherein:
   the connecting plate has at least two male and two female parts of a positive and/or non-positive connection;
   a male part of the first antenna housing engages in the female part of the connecting plate,
   a male part of the connecting plate engages in the female part of the first antenna housing;
   a male part of the second antenna housing engages in the female part of the connecting plate; and
   a male part of the connecting plate engages in the female part of the second antenna housing.

25. Modular housing arrangement according to claim 16, wherein:
   the intermediate part of the spacer has a honeycomb-like or lattice-like structure; and/or
   the connecting plate has a honeycomb-like or lattice-like structure.

26. Modular housing arrangement according to claim 1, wherein:
   the at least one antenna housing can be attached by means of the at least one male and female part of the positive and/or non-positive connection to corresponding parts on a base structure and/or carrier plate which are part of a building structure.

27. Modular housing arrangement according to claim 1, wherein:
   the modular housing arrangement comprises an outer housing; and
   the outer housing surrounds all of the antenna housings collectively.

\* \* \* \* \*